(12) United States Patent
Fan

(10) Patent No.: US 10,886,481 B2
(45) Date of Patent: Jan. 5, 2021

(54) DISPLAY SUBSTRATE WITH ANGLE-ADJUSTING PORTION, MANUFACTURING METHOD THEREOF, AND DISPLAY DEVICE

(71) Applicant: BOE TECHNOLOGY GROUP CO., LTD., Beijing (CN)

(72) Inventor: Xing Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 16/384,022

(22) Filed: Apr. 15, 2019

(65) Prior Publication Data
US 2019/0334102 A1 Oct. 31, 2019

(30) Foreign Application Priority Data
Apr. 28, 2018 (CN) .......................... 2018 1 0400386

(51) Int. Cl.
*H01L 51/00* (2006.01)
*H01L 27/32* (2006.01)
*H01L 51/50* (2006.01)
*H01L 51/56* (2006.01)

(52) U.S. Cl.
CPC ...... *H01L 51/0097* (2013.01); *H01L 27/3246* (2013.01); *H01L 51/001* (2013.01); *H01L 51/5012* (2013.01); *H01L 51/56* (2013.01)

(58) Field of Classification Search
CPC . H01L 51/5262; H01L 51/52; H01L 51/0097; H01L 27/3246; H05K 1/0277; H05K 1/0281; G06F 1/1652; G02F 1/133305
See application file for complete search history.

(56) References Cited

U.S. PATENT DOCUMENTS

| 6,992,718 B1 * | 1/2006 | Takahara ............... G02B 23/14 |
| | | 348/333.09 |
| 9,570,527 B2 * | 2/2017 | Namkung ........... H01L 27/3258 |
| 10,741,614 B2 * | 8/2020 | Son ..................... G02B 27/0172 |
| 2003/0002179 A1 * | 1/2003 | Roberts ................. G02F 1/1533 |
| | | 359/838 |

(Continued)

FOREIGN PATENT DOCUMENTS

| CN | 104282721 A | 1/2015 |
| CN | 107403811 A | 11/2017 |

(Continued)

OTHER PUBLICATIONS

Chinese Office Action in Chinese Application No. 201810400386.3, dated May 29, 2020 with English translation.

*Primary Examiner* — Victoria K. Hall
(74) *Attorney, Agent, or Firm* — Collard & Roe, P.C.

(57) ABSTRACT

A display substrate, a manufacturing method thereof, and a display device are provided. The display substrate includes: a base substrate including a main portion and an edge portion located on at least one side of the main portion; a first pixel located on the edge portion and including a first light-emitting surface; and an angle-adjusting portion located between the first pixel and the edge portion and configured to provide an included angle between the first light-emitting surface and the edge portion at a position where the first pixel is located, the included angle being not zero.

19 Claims, 6 Drawing Sheets

(56) References Cited

U.S. PATENT DOCUMENTS

| | | | | |
|---|---|---|---|---|
| 2005/0062412 | A1* | 3/2005 | Taniguchi | F21K 9/232 313/512 |
| 2009/0135599 | A1* | 5/2009 | Lin | H05K 3/301 362/249.02 |
| 2010/0065832 | A1* | 3/2010 | Sugimoto | H01L 27/3293 257/40 |
| 2010/0296285 | A1* | 11/2010 | Chemel | H05B 47/12 362/235 |
| 2010/0302779 | A1* | 12/2010 | Chemel | H05B 47/155 362/249.02 |
| 2011/0001436 | A1* | 1/2011 | Chemel | H05B 47/155 315/291 |
| 2011/0002119 | A1* | 1/2011 | Huang | F21V 29/76 362/249.02 |
| 2011/0018009 | A1* | 1/2011 | Krumaccher | H01L 51/5271 257/88 |
| 2011/0026253 | A1* | 2/2011 | Gill | F21V 19/001 362/249.02 |
| 2011/0149600 | A1* | 6/2011 | Jang | H01L 33/642 362/612 |
| 2011/0149601 | A1* | 6/2011 | Jang | H01L 25/0753 362/612 |
| 2011/0157885 | A1* | 6/2011 | Visser | F21V 33/006 362/235 |
| 2012/0235579 | A1* | 9/2012 | Chemel | F21S 2/005 315/152 |
| 2013/0099258 | A1* | 4/2013 | Lim | H01L 51/5225 257/88 |
| 2015/0001477 | A1* | 1/2015 | Namkung | H01L 27/3258 257/40 |
| 2015/0194632 | A1* | 7/2015 | Schwamb | H01L 51/5275 257/40 |
| 2017/0005295 | A1 | 1/2017 | Takeda et al. | |
| 2017/0074497 | A1* | 3/2017 | Jurik | F21V 14/06 |
| 2017/0184264 | A1* | 6/2017 | Gomi | F21S 43/195 |
| 2017/0256692 | A1* | 9/2017 | Van Bommel | H01L 33/24 |
| 2018/0047798 | A1* | 2/2018 | Abe | H01L 27/3272 |
| 2019/0074337 | A1 | 3/2019 | Xie et al. | |
| 2019/0165052 | A1* | 5/2019 | Son | H01L 27/322 |
| 2019/0198576 | A1* | 6/2019 | Schubert | G02B 26/004 |
| 2019/0198793 | A1* | 6/2019 | Guo | H01L 51/5209 |
| 2019/0199982 | A1* | 6/2019 | Schubert | G03B 21/145 |
| 2019/0369778 | A1* | 12/2019 | Kwak | G06F 3/044 |
| 2019/0376650 | A1* | 12/2019 | Pang | F21K 9/90 |
| 2020/0209686 | A1* | 7/2020 | Shan | G02F 1/133382 |
| 2020/0209689 | A1* | 7/2020 | Shan | G02F 1/133603 |

FOREIGN PATENT DOCUMENTS

| | | | | |
|---|---|---|---|---|
| CN | 107665910 A | | 2/2018 | |
| WO | WO-2008123416 A1 | * | 10/2008 | ............... G09F 9/00 |
| WO | WO-2011013276 A1 | * | 2/2011 | ............. H01L 33/02 |

* cited by examiner

DISPLAY SUBSTRATE WITH ANGLE-ADJUSTING PORTION, MANUFACTURING METHOD THEREOF, AND DISPLAY DEVICE

CROSS REFERENCE TO RELATED APPLICATIONS

This present application claims priority to Chinese patent application No. 2018/10400386.3 filed on Apr. 28, 2018, the entire disclosure of the above-mentioned Chinese patent application is incorporated herein by reference as part of embodiments of the present disclosure.

TECHNICAL FIELD

At least one embodiment of the present disclosure relates to a display substrate, a manufacturing method thereof, and a display device.

BACKGROUND

A display device using an Organic Light-Emitting Diode (OLED) display panel has broad application prospects due to its advantages such as simple manufacturing process, fast response, thin, light weight, wide viewing angle, self-luminescence, high brightness, continuously adjustable color, low power consumption, low cost, easy realization on flexible display, and so on.

SUMMARY

At least one embodiment of the present disclosure relates to a display substrate, a manufacturing method thereof, and a display device, which can improve color shift at edges of the display device.

At least one embodiment of the present disclosure provides a display substrate, including: a base substrate, a first pixel, and an angle-adjusting portion; the base substrate includes a main portion and an edge portion located on at least one side of the main portion; the first pixel is located on the edge portion and includes a first light-emitting surface; and the angle-adjusting portion is located between the first pixel and the edge portion and is configured to provide an included angle between the first light-emitting surface and the edge portion at a position where the first pixel is located, the included angle being not zero.

According to the display substrate provided by one or more embodiments of the present disclosure, the edge portion is curved with respect to the main portion.

According to the display substrate provided by one or more embodiments of the present disclosure, the included angle is an acute angle, and the acute angle is greater than or equal to 30° and less than or equal to 60°.

According to the display substrate provided by one or more embodiments of the present disclosure, a cross-section of the angle-adjusting portion in a direction perpendicular to the base substrate is in a shape of a triangle.

According to the display substrate provided by one or more embodiments of the present disclosure, an angle of the triangle opposite to the edge portion is greater than or equal to 80° and less than or equal to 120°.

According to the display substrate provided by one or more embodiments of the present disclosure, the angle-adjusting portion has a planar surface on which the first pixel is located.

According to the display substrate provided by one or more embodiments of the present disclosure, the planar surface is parallel with the main portion.

According to the display substrate provided by one or more embodiments of the present disclosure, the first pixel includes a first electrode that is in contact with the planar surface.

According to the display substrate provided by one or more embodiments of the present disclosure, the display substrate further includes a first pixel defining layer located on the edge portion, wherein the first pixel defining layer is arranged around an edge of the first electrode, the first pixel defining layer includes a first pixel-defining portion close to the edge portion and a second pixel-defining portion away from the edge portion, and the first pixel-defining portion and the second pixel-defining portion are located on edges of the angle-adjusting portion, respectively.

According to the display substrate provided by one or more embodiments of the present disclosure, a cross-section of the first pixel-defining portion in a direction perpendicular to the base substrate is in a shape of a sector with an acute angle or a right angle.

According to the display substrate provided by one or more embodiments of the present disclosure, a cross-section of the second pixel-defining portion in a direction perpendicular to the base substrate is in a shape of a sector having a central angle greater than 180°.

According to the display substrate provided by one or more embodiments of the present disclosure, the display substrate further includes a second pixel located on the main portion, wherein the second pixel includes a second light-emitting surface, and the first light-emitting surface is parallel with the second light-emitting surface.

According to the display substrate provided by one or more embodiments of the present disclosure, a plurality of first pixels and a plurality of angle-adjusting portions in a one-to-one correspondence with the plurality of first pixels are provided, and the plurality of angle-adjusting portions are in a stair shape or in a sawtooth shape.

At least one embodiment of the present disclosure further provides a manufacturing method of a display substrate, including: forming an angle-adjusting portion on an edge portion of a base substrate, the base substrate further including a main portion, the edge portion being located on at least one side of the main portion; and forming a first pixel on the angle-adjusting portion, the first pixel including a first light-emitting surface; the angle-adjusting portion is configured to provide an included angle between the first light-emitting surface and the edge portion at a position where the first pixel is located, and the included angle is not zero.

According to the manufacturing method of the display substrate provided by one or more embodiments of the present disclosure, forming the first pixel includes forming a first electrode, and the angle-adjusting portion has a planar surface on which the first pixel is located.

According to the manufacturing method of the display substrate provided by one or more embodiments of the present disclosure, the first electrode is in contact with the planar surface.

According to the manufacturing method of the display substrate provided by one or more embodiments of the present disclosure, forming the first pixel further includes forming a first pixel defining layer on the first electrode, the first pixel defining layer is arranged around an edge of the first electrode, the first pixel defining layer includes a first pixel-defining portion close to the edge portion and a second pixel-defining portion away from the edge portion, and the first pixel-defining portion and the second pixel-defining portion are located on edges of the angle-adjusting portion, respectively.

According to the manufacturing method of the display substrate provided by one or more embodiments of the present disclosure, the method further includes bending the base substrate with the first pixel defining layer formed thereon, and forming an evaporation deposition layer by an evaporation deposition process after bending the base substrate to form the first pixel.

According to the manufacturing method of the display substrate provided by one or more embodiments of the present disclosure, the method further includes bending the base substrate with the first pixel formed thereon.

At least one embodiment of the present disclosure further provides a display device including any display substrate as described above.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objects, technical details and advantages of the embodiments of the present disclosure apparent, technical solutions according to the embodiments of the present disclosure will be described clearly and completely as below in conjunction with the accompanying drawings of embodiments of the present disclosure. Apparently, the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, the technical terminology or scientific terminology used herein should have the same meaning as commonly understood by one of ordinary skill in the art to which this disclosure belongs. Likewise, terms like "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" or the like is only used to describe a relative positional relationship, and when the absolute position of a described object is changed, the relative positional relationship might also be changed accordingly.

Generally, a display screen with a curved edge can be formed by bending at least one side of a display screen. For example, an edge of a display screen may be bent to be curved or inclined with respect to a middle portion.

Figure 1A:
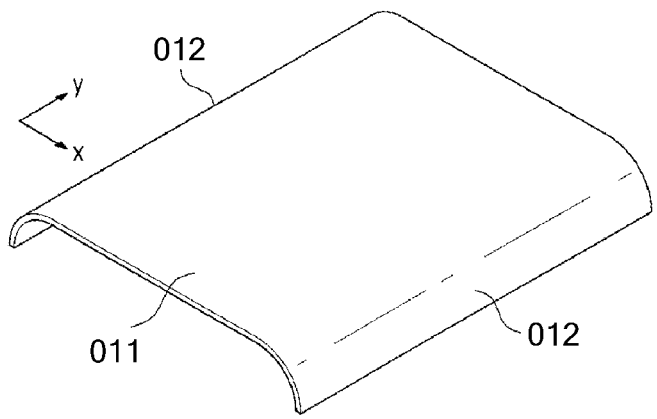
FIG. 1A is a perspective view illustrating a display screen with a curved edge.

FIG. 1A is a perspective view illustrating a display screen with a curved edge. As illustrated in FIG. 1A, the display screen 01 includes a flat display portion 011 and an edge display portion 012 located on at least one side of the flat display portion 011. The display screen with this structure has a color shift problem when displaying. That is, the color of the edge display portion 012 is not consistent with the color of the flat display portion 011.

This color shift problem occurs for the below reasons: in the process of manufacturing a display screen with a curved edge, firstly performing an evaporation deposition process on an entire screen, at this time, in the screen, a light-emitting direction of a pixel on the flat display portion 011 and a light-emitting direction of a pixel on the edge display portion 012 are the same; and then performing a bending process, the facing directions of the pixels on the edge display portion 012 and the pixels on the flat display portion 011 are no longer the same, and the light-emitting direction of the pixel on the edge display portion 012 and the light-emitting direction of the pixel on the flat display portion 011 are different. In general, because most display screens with a curved edge are top-emission devices, micro-cavity enhancement technology is used and causes the light emission situation at a front surface to be different from the light emission situation at other positions except the front surface, resulting in color and/or brightness difference between the edge display portion 012 and the flat display portion 011, thus causing a color shift problem.

Figure 1B:
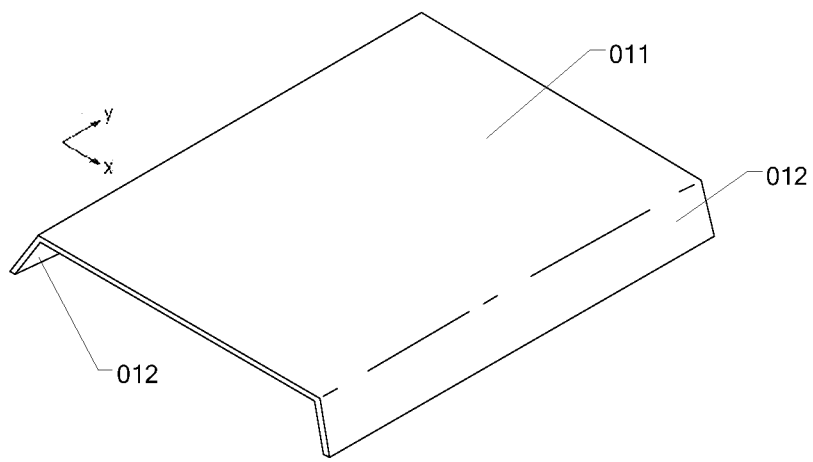
FIG. 1B is a perspective view illustrating another display screen with a curved edge (a bent display screen)

FIG. 1B is a perspective view illustrating a display screen with its edge bent into an inclined plane. The display screen illustrated in FIG. 1B also has a color shift problem at the edge of the display screen.

Figure 1C:
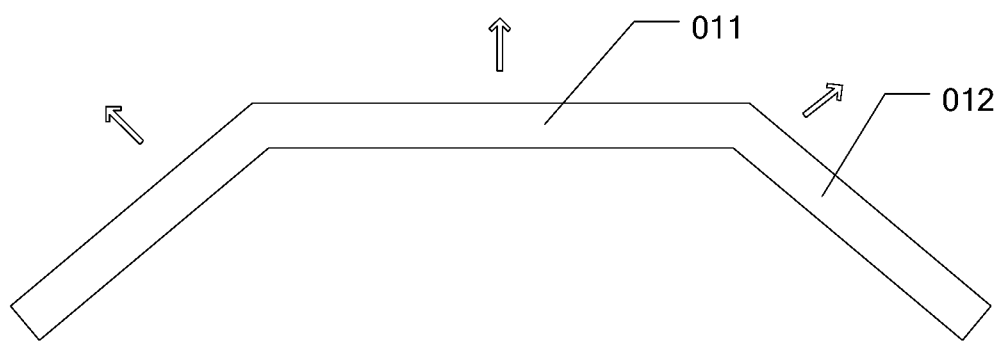
FIG. 1C is a schematic cross-sectional view illustrating light-emitting directions of a flat display portion and an edge display portion of a curved display screen illustrated in FIG. 1B.

FIG. 1C is a schematic view illustrating light-emitting directions of the flat display portion 011 and the edge display portion 012 of the display screen with the edge bent into an inclined plane illustrated in FIG. 1B. The light-emitting direction of the flat display portion 011 is different from that of the edge display portion 012, so that a color shift problem easily occurs at the edge.

Figure 2A:
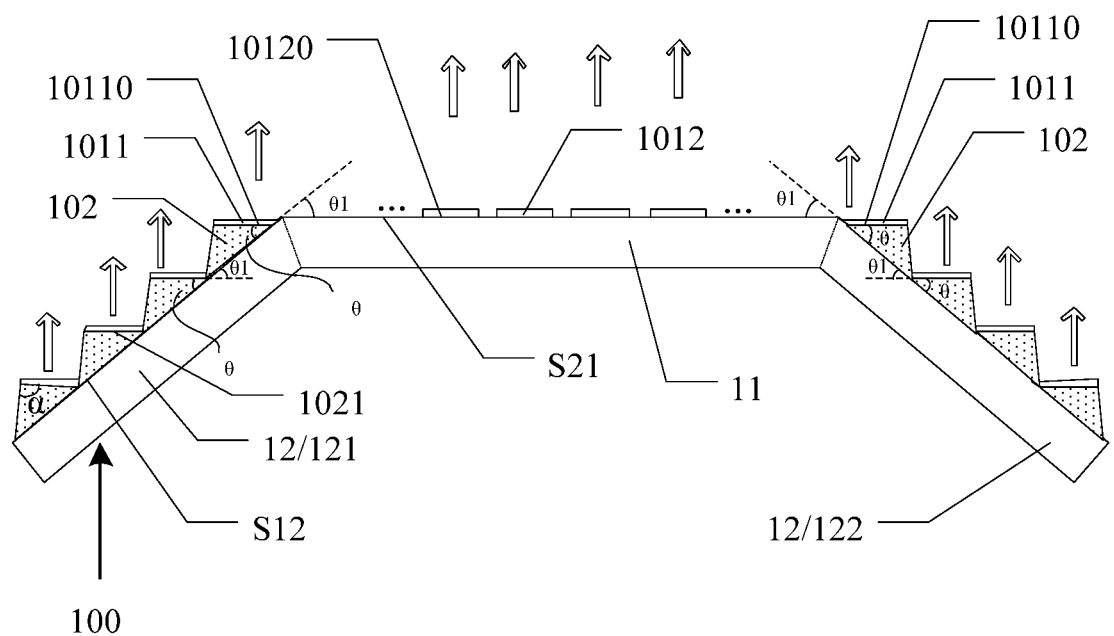
FIG. 2A is a cross-sectional view illustrating a curved display substrate provided by an embodiment of the present disclosure.

FIG. 2A is a cross-sectional view illustrating a display substrate with a curved edge provided by an embodiment of the present disclosure. The display substrate includes a base substrate 100, a first pixel 1011, and an angle-adjusting portion 102. The base substrate 100 includes a main portion 11 and an edge portion 12 located on at least one side of the main portion 11. The first pixel 1011 is located on the edge portion 12 and includes a first light-emitting surface 10110. The angle-adjusting portion 102 is located between the first pixel 1011 and the edge portion 12, and is configured to provide an included angle θ between the first light-emitting surface 10110 and a part of the edge portion 12 where the first pixel 1011 is located, and the included angle θ is not zero. In some embodiments, the angle-adjusting portion 102 is configured to provide an included angle θ between the first light-emitting surface 10110 and the edge portion 12. In some embodiments, the angle-adjusting portion 102 is configured to provide an included angle θ between the first light-emitting surface 10110 and a part of the edge portion 12 where the first light-emitting surface 10110 is located. For example, an included angle between an element and the edge portion 12 may refer to an included angle between the element and a surface of the edge portion 12. For example, the surface of the edge portion 12 is a surface S12 of the edge portion 12 close to the element. For example, the element refers to the first light-emitting surface 10110 or the first pixel 1011.

For example, as illustrated in FIG. 2A, the edge portion 12 includes a first edge portion 121 located on a left side and a second edge portion 122 located on a right side. The embodiment of the present disclosure is described with reference to the case where the edge portion includes a first edge portion and a second edge portion that are opposite to each other, by way of example.

For example, the base substrate 100 may be a flexible base substrate. For example, a material of the base substrate 100 may include polyimide (PI), without limited thereto.

For example, as illustrated in FIG. 2A, the display substrate further includes a second pixel 1012 located on the main body 11, and the second pixel 1012 includes a second light-emitting surface 10120. For example, a light-emitting direction of the first pixel 1011 is perpendicular to the first light-emitting surface 10110. For example, a light-emitting direction of the second pixel 1012 is perpendicular to the second light-emitting surface 10120. For example, the light-emitting direction of the first pixel 1011 may be a light-emitting direction of most light emitted from the first pixel 1011. For example, the light-emitting direction of the second pixel 1012 may be a light-emitting direction of most light emitted from the second pixel 1012. For example, the second light-emitting surface 10120 is parallel with the main portion 11. For example, in order to reduce color shift as much as possible, the first light-emitting surface 10110 is parallel with the main body 11, without limited thereto. For example, the first light-emitting surface 10110 is parallel with a surface S21 of the main body 11.

In the display substrate provided by one or more embodiments of the present disclosure, by employing an angle-adjusting portion 102, an angle between the first light-emitting surface 10110 of the first pixel 1011 on the edge portion 12 and the edge portion 12 can be provided, so that the light-emitting direction of the first pixel 1011 can be adjusted to reduce the color shift problem at edge.

For example, the angle-adjusting portion 102 can allow the light-emitting direction of the first pixel 1011 on the edge portion 12 to be substantially the same as the light-emitting direction of the second pixel 1012 located on the main portion 11 to minimize the color shift problem at edge.

As illustrated in FIG. 2A, according to the display substrate provided by one or more embodiments of the present disclosure, in order to better reduce the color shift problem at edge, the first light-emitting surface 10110 may be parallel with the second light-emitting surface 10120. In this case, the light-emitting direction of the first pixel 1011 is the same as the light-emitting direction of the second pixel 1012, which can minimize the color shift problem at edge.

As illustrated in FIG. 2A, according to the display substrate provided by one or more embodiments of the present disclosure, the edge portion 12 is inclined with respect to the main portion 11, of course, the edge portion 12 may be bent into a curved surface with respect to the main portion 11, and the case where the edge portion 12 is bent into a curved surface with respect to the main portion 11 will be described later. For example, in the case where the edge portion 12 is inclined with respect to the main portion 11, an acute angle θ1 between the edge portion 12 and the main portion 11 is formed. For example, in order to facilitate the adjustment of an inclined angle of the first pixel 1011 on the edge portion 12, the angle θ may be determined according to the angle θ1. For example, the included angle θ may be the same as the included angle θ1, without limited thereto. For example, the included angle θ1 may be greater than or equal to 30° and less than or equal to 60°, without limited thereto.

As illustrated in FIG. 2A, according to the display substrate provided by one or more embodiments of the present disclosure, the included angle θ may be an acute angle, and the acute angle may be greater than or equal to 30° and less than or equal to 60° according to a normal bending angle of a display screen. It should be understood that the included angle θ is not limited to the angle given above and can be adjusted as required.

As illustrated in FIG. 2A, according to the display substrate provided by one or more embodiments of the present disclosure, the angle-adjusting portion 102 has a planar surface 1021, and the first pixel 1011 is located on the planar surface 1021. The planar surface can facilitate the angle-adjusting portion 102 to better support the first pixel 1011 thereon so that a light-emitting direction of the first pixel 1011 is substantially the same as that of the second pixel 1012.

As illustrated in FIG. 2A, according to a display substrate provided by one or more embodiments of the present disclosure, the planar surface 1021 may be parallel with the main portion 11. For example, the planar surface 1021 may be parallel with a surface S21 of the main portion 11. This arrangement can be advantageous for the first pixel 1011 to be parallel with the second pixel 1012, so that the first pixel 1011 and the second pixel 1012 have the same or substantially the same light-emitting direction, which is advantageous for reducing color shift.

As illustrated in FIG. 2A, according to a display substrate provided by one or more embodiments of the present disclosure, a cross-section of the angle-adjusting portion 102 in a direction perpendicular to the base substrate is in a shape of a triangle. For example, an angle α of the triangle opposite to the edge portion 12 may be greater than or equal to 80° and less than or equal to 120°. For example, the angle α of the triangle opposite to the edge portion 12 is an angle of the triangle facing or directly facing the edge portion 12. For example, the angle α of the triangle opposite to the edge portion 12 may be 90°. The shapes of an evaporation deposition layer and/or an opposing electrode located on the edge portion may vary according to different values of the angle α of the triangle opposite to the edge portion 12. For example, in the case where the angle α of the triangle opposite to the edge portion 12 is greater than 90° and less than or equal to 120°, it may be advantageous to form an opposing electrode arranged on the whole surface.

As illustrated in FIG. 2A, according to a display substrate provided by one or more embodiments of the present disclosure, the display substrate may include a plurality of first pixels 1011 and a plurality of angle-adjusting portions 102 in a one-to one correspondence with the plurality of first pixels 1011, the plurality of angle-adjusting portions 102 are in a stair shape or in a sawtooth shape, without limited thereto.

As illustrated in FIG. 2A, in the embodiment of the present disclosure, an embodiment is described with reference to the case where each edge portion 12 includes four angle-adjusting portions 102, by way of example, without limited thereto. The number of the angle-adjusting portions 102 may be determined as required.

Figure 2B:
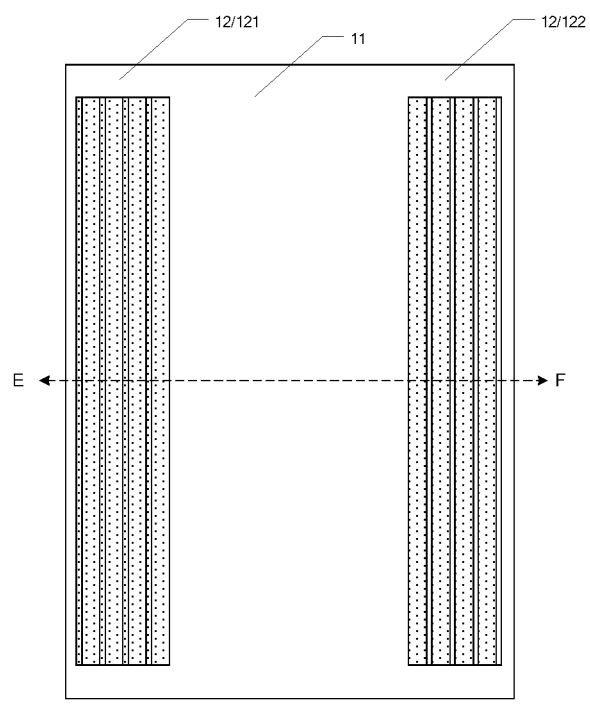
FIG. 2B is a top view illustrating a plurality of angle-adjusting portions on a display substrate provided by one or more embodiments of the present disclosure.

FIG. 2B is a top view illustrating a plurality of angle-adjusting portions 102 on a display substrate provided by one or more embodiments of the present disclosure. For the sake of clarity, other structures are not omitted in FIG. 2B. For example, in order to make the pixel structure compact, adjacent angle-adjusting portions 102 may be in contact with each other in a plan view of the display substrate.

Figure 3A:
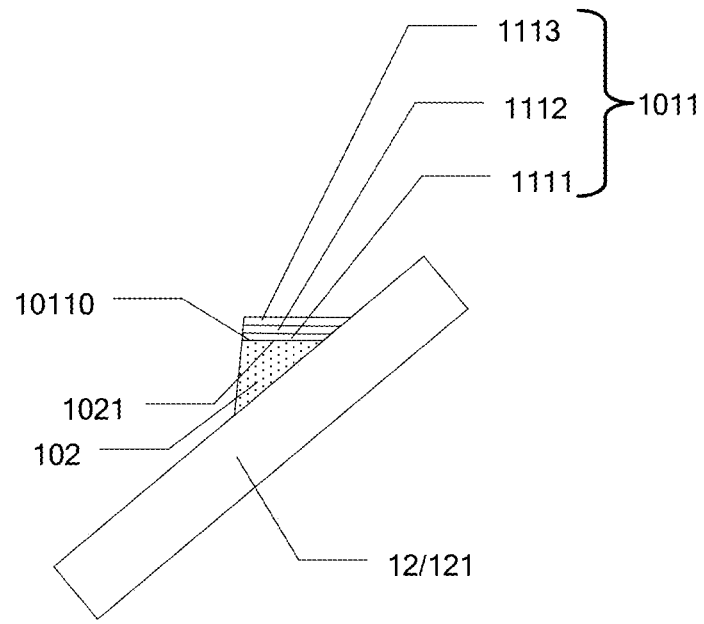
FIG. 3A is a schematic cross-sectional view illustrating a composition of a first pixel on an edge portion of a display substrate provided by one or more embodiments of the present disclosure.

FIG. 3A is a schematic cross-sectional view illustrating a composition of a first pixel on an edge portion of a display substrate provided by one or more embodiments of the present disclosure. As illustrated in FIG. 3A, the first pixel 1011 includes a first electrode 1111 that may be in contact with the planar surface 1021, without limited thereto. As illustrated in FIG. 3A, the first pixel 1011 further includes a light-emitting functional layer 1112 and an opposing electrode 1113 on the first electrode 1111.

Figure 3B:
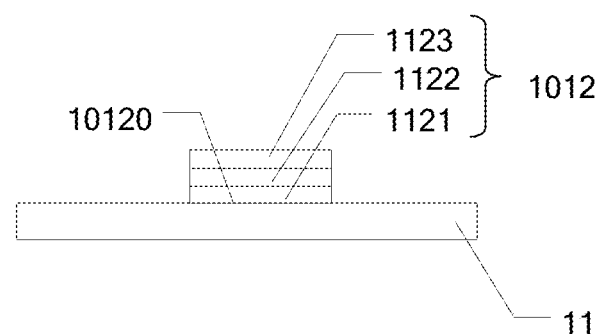
FIG. 3B is a schematic cross-sectional view illustrating a composition of a second pixel on a main portion of a display substrate provided by one or more embodiments of the present disclosure.

FIG. 3B is a schematic cross-sectional view illustrating a composition of a second pixel on a main portion of a display substrate provided by one or more embodiments of the present disclosure. As illustrated in FIG. 3B, the second pixel 1012 includes a second electrode 1121, a light-emitting functional layer 1122, and an opposing electrode 1123 stacked in this order.

For example, the first light-emitting surface 10110 may be an upper surface (a surface away from the angle-adjusting portion 102) or a lower surface (a surface close to the angle-adjusting portion 102) of any one of the first electrode 1111, the light-emitting functional layer 1112, and the opposing electrode 1113 in the first pixel 1011. An embodiment of the present disclosure is described with reference to the case where the lower surface of the first electrode 1111 is taken as the first light-emitting surface 10110, by way of example.

For example, the second light-emitting surface 10120 may be an upper surface (a surface away from the main portion 11) or a lower surface (a surface close to the main portion 11) of any one of the second electrode 1121, the light-emitting functional layer 1122, and the opposing electrode 1123 in the second pixel 1012. An embodiment of the present disclosure is described with reference to the case where the lower surface of the second electrode 1121 is taken as the second light-emitting surface 10120, by way of example.

For example, in order to simplify process, the first electrode 1111 and the second electrode 1121 may be formed from the same film layer by the same patterning process. For example, the light-emitting functional layer 1112 and the light-emitting functional layer 1122 may be formed by the same evaporation deposition process at the same time, without limiting the embodiments thereto, and may also be separately formed by different evaporation deposition processes. The opposing electrode 1113 and the opposing electrode 1123 may be formed from the same film layer by the same patterning process. For example, the light-emitting functional layer 1112 and the light-emitting functional layer 1122 may be referred to as evaporation deposition layers.

For example, the first pixel 1011 may be the smallest independently controllable display unit for display. For example, the second pixel 1012 may be the smallest independently controllable display unit for display. For example, the first pixel 1011 and the second pixel 1012 may be organic light-emitting diodes, without limited thereto. In FIG. 3A and FIG. 3B, a control element that control on and off of the first pixel 1011 and a control element that control on and off of the second pixel 1012 are omitted, for example, the control element includes a thin film transistor and the like.

For example, the light-emitting functional layer 1112 and the light-emitting functional layer 1122 may be a single layer or may include a plurality of sub-layers. For example, in the case where the first pixel 1011 and the second pixel 1012 are organic light-emitting diodes, the light-emitting functional layer 1112 may include at least one selected from the group consisting of a light-emitting layer, a hole transporting layer, a hole injecting layer, a hole blocking layer, an electron transporting layer, an electron injecting layer, and an electron blocking layer. The light-emitting functional layer 1122 may also include at least one selected from the group consisting of a light-emitting layer, a hole transporting layer, a hole injecting layer, a hole blocking layer, an electron transporting layer, an electron injecting layer, and an electron blocking layer.

For example, the hole blocking layer may be disposed between the electron transporting layer and the light-emitting layer, and the electron blocking layer may be disposed between the hole transporting layer and the light-emitting layer, without limiting the embodiments thereto. A material of each layer of the organic light-emitting diode can refer to the common design.

Figure 4A:
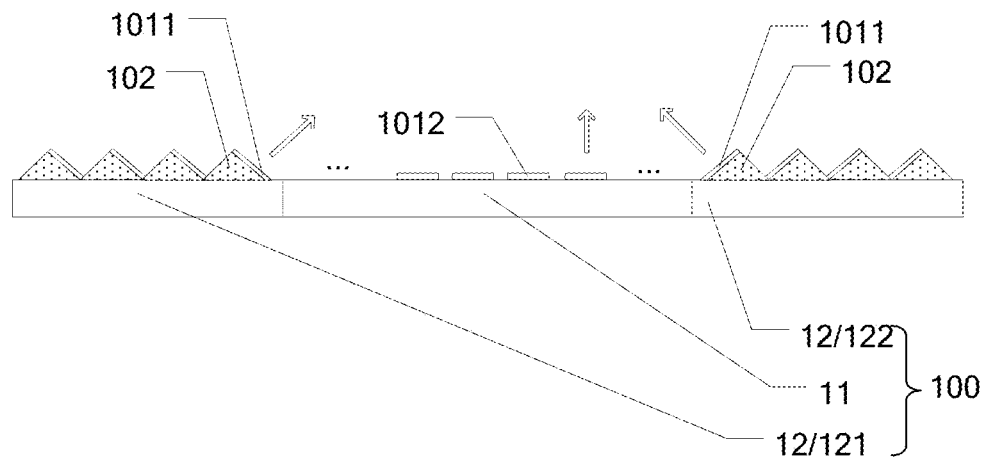
FIG. 4A is a cross-sectional view illustrating a display substrate provided by an embodiment of the present disclosure.

FIG. 4A is a cross-sectional view illustrating a display substrate provided by an embodiment of the present disclosure. As illustrated in FIG. 4A, in the embodiment of the present disclosure, the edge portion may not be bent in order to facilitate light of the edge portion to irradiate to a middle portion of the display screen. In this case, the first pixel 1011 and the second pixel 1012 are not parallel with each other, and the light-emitting directions of the first pixel 1011 and the second pixel 1012 are different. The display substrate illustrated in FIG. 4A may be a display substrate obtained before a bending process of the display substrate illustrated in FIG. 4A, however, the display substrate provided by this embodiment is not bent.

Figure 4B:
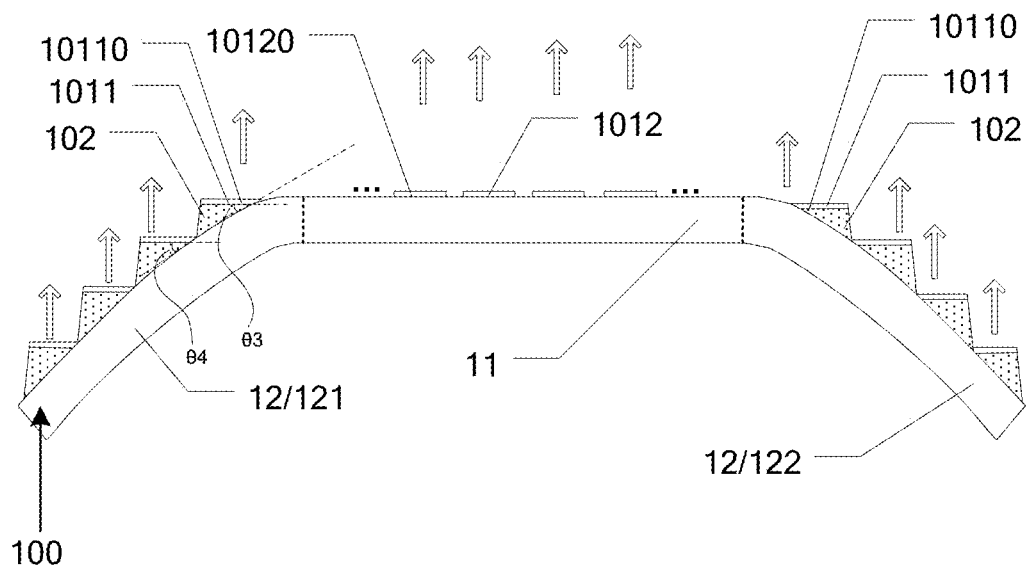
FIG. 4B is a cross-sectional view illustrating a curved display substrate provided by another embodiment of the present disclosure.

FIG. 4B is a cross-sectional view illustrating a display substrate provided by another embodiment of the present disclosure. As illustrated in FIG. 4B, the edge portion 12 is bent to form a display screen with an edge bent into a curved surface.

For example, as illustrated in FIG. 4B, the included angle θ between the first light-emitting surface 10110 and a part of the edge portion 12 where the first pixel 1011, to which the first light-emitting surface belongs, is located varies depending on different positions of the edge portion 12. For example, as illustrated in FIG. 4B, an included angle θ3 between a first light-emitting surface 10110 close to the main portion 11 and the edge portion 12 is smaller than an included angle θ4 between a first light-emitting surface 10110 away from the main portion 11 and the edge portion 12. The included angle θ between the first light-emitting surface 10110 and a part of the edge portion 12 where the first pixel 1011, to which the first light-emitting surface belongs, is located may be determined and may vary according to a bending condition of the curved display panel. Of course, in other embodiments, for convenience of manufacturing, different first light-emitting surfaces 10110 have the same angle θ with respect to the edge portion 12 at positions where the first pixels 1011 to which the different first light-emitting surfaces 10110 belong.

For example, as illustrated in FIG. 4B, the first light-emitting surface 10110 of the first pixel 1011 is parallel with the second light-emitting surface 10120 of the second pixel 1012. A light-emitting direction of the first pixel 1011 and a light-emitting direction of the second pixel 1012 are the same.

For example, an angle at which the edge portion of the display device is bent or an extent to which the edge portion of the display device is bent is not limited in the embodiment of the present disclosure.

Figure 5:
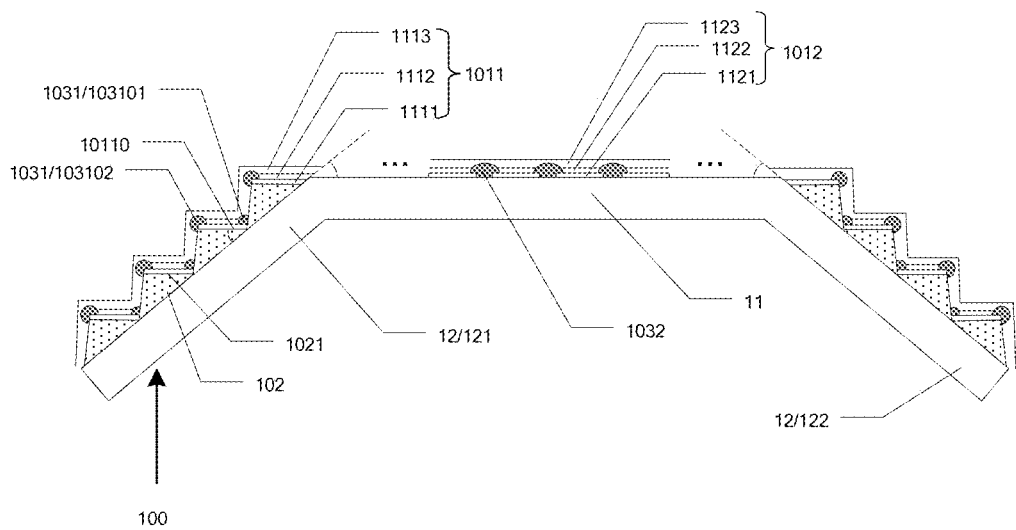
FIG. 5 is a cross-sectional view illustrating a display substrate provided by an embodiment of the present disclosure.

FIG. 5 is a cross-sectional view illustrating a display substrate provided by an embodiment of the present disclosure. As illustrated in FIG. 5, the display substrate further includes a first pixel defining layer 1031 located on the edge portion 12. The first pixel defining layer 1031 is disposed around an edge of the first electrode 1111. The first pixel defining layer 1031 includes a first pixel-defining portion 103101 close to the edge portion 12 and a second pixel-defining portion 103102 away from the edge portion 12, and the first pixel-defining portion 103101 and the second pixel-defining portion 103102 are located on edges of the angle-adjusting portion 102, respectively. For example, a cross section of the first pixel-defining portion 103101 in a direction perpendicular to the base substrate is in a sector-shaped or approximately sector-shaped structure. For example, the cross section of the first pixel-defining portion 103101 in the direction perpendicular to the base substrate is in a shape of a sector with an acute angle or a right angle. For example, a cross section of the second pixel-defining portion 103102 in a direction perpendicular to the base substrate is in a sector-shaped or approximately sector-shaped structure. For example, the cross section of the second pixel-defining portion 103102 in the direction perpendicular to the base substrate is in a shape of a sector with a central angle greater than 180°. For further example, the cross section of the second pixel-defining portion 103102 in the direction perpendicular to the base substrate is in a shape of a sector with a central angle more than 180° and less than or equal to 270°.

For example, as illustrated in FIG. 5, each angle-adjusting portion 102 has a planar surface 1021 configured to support the first pixel 1011 located thereon. For example, the plurality of planar surfaces 1021 may be parallel with each other.

For example, as illustrated in FIG. 5, a second pixel defining layer 1032 may also be provided on the main portion 11. For example, the second pixel defining layer 1032 and the first pixel defining layer 1031 may be formed from the same film layer by the same patterning process.

As illustrated in FIG. 5, the opposing electrode 1113 and the opposing electrode 1123 may be formed in the same layer and may be formed from the same film layer.

As illustrated in FIG. 5, opposing electrodes 1113 of different first pixels 1011 are electrically connected with each other. Opposing electrodes 1123 of different second pixels 1012 are electrically connected with each other. For example, the opposing electrode 1113 and the opposing electrode 1123 may be electrically connected with each other to form a whole-surface covering structure.

The embodiment of the present disclosure is described with reference to the case where a bending direction of the base substrate is opposite to the light-emitting direction of the first pixel and/or the second pixel, without limited thereto. For example, in other embodiments, the bending direction of the base substrate may also be the same as the light-emitting direction of the first pixel and/or the second pixel.

For example, the display substrate provided by the embodiment of the present disclosure may be manufactured using a manufacturing method provided by the embodiment of the present disclosure. The manufacturing method of the display substrate will be described below.

At least one embodiment of the present disclosure further provides a manufacturing method of a display substrate, including: forming an angle-adjusting portion 102 on an edge portion 12 of a base substrate 100, the base substrate 100 further including a main portion 11, the edge portion 12 being located on at least one side of the main portion 11; and forming a first pixel 1011 on the angle-adjusting portion 102, the first pixel 1011 including a first light-emitting surface 10110; the angle-adjusting portion 102 is configured to provide an included angle θ between the first light-emitting surface 10110 and the edge portion 12 at a position where the first pixel 1011 is located, and the included angle θ is not zero.

According to the manufacturing method of the display substrate provided by at least one embodiment of the present disclosure, before forming the first pixel 1011, an angle-adjusting portion 102 is formed on the edge portion 12 to allow an included angle θ to be formed between the first light-emitting surface 10110 and the edge portion 12 at the position where the first pixel 1011 is located, so as to adjust the light-emitting direction of the first pixel 1011 to reduce color shift problem at edge.

For example, the manufacturing method further includes forming a second pixel 1012 on the main body 11, the second pixel 1012 includes a second light-emitting surface 10120, and the second light-emitting surface 10120 may be parallel with the first light-emitting surface 10110, so that the first pixel 1011 and the second pixel 1012 have the same light-emitting direction to the greatest extent, and the color shift problem at edge is minimized.

Figure 6A:
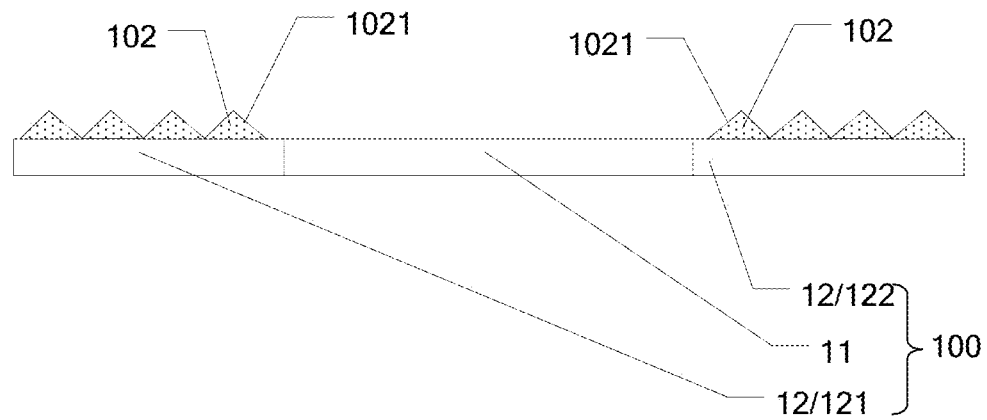
FIG. 6A-FIG. 6C are schematic diagrams illustrating a manufacturing method of a display substrate provided by an embodiment of the present disclosure.
Figure 6B:
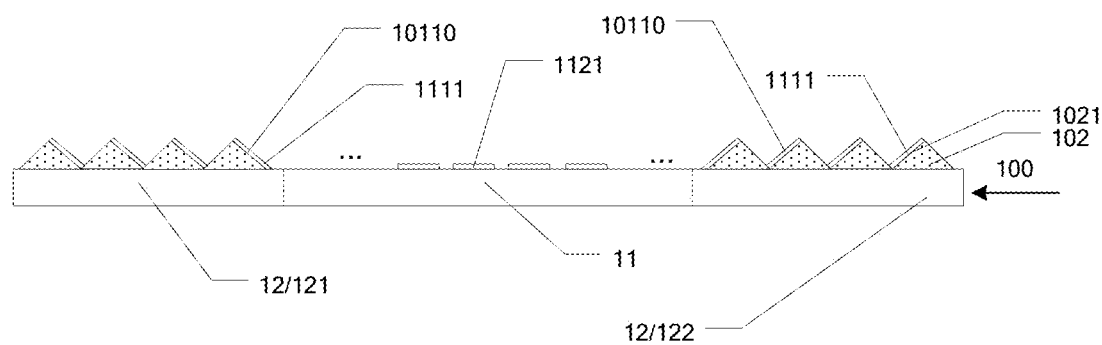
Figure 6C:
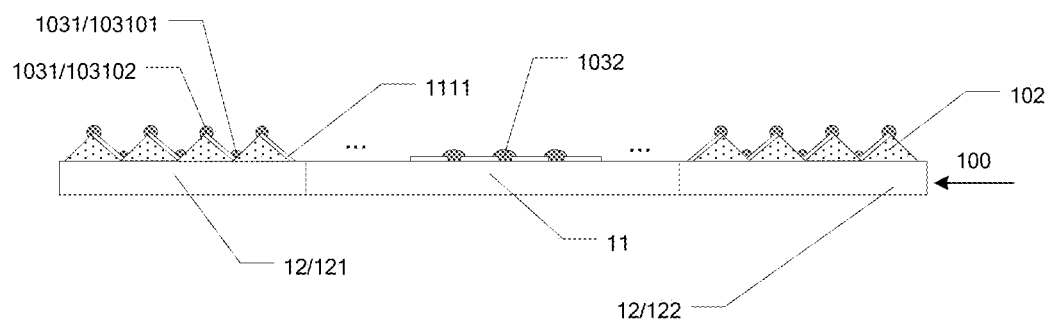

FIG. 6A-FIG. 6C are manufacturing methods of a display substrate provided by an embodiment of the present disclosure, and the below will be described in detail with reference to FIG. 6A-FIG. 6C.

Step 1. As illustrated in FIG. 6A, forming an angle-adjusting portion 102 on an edge portion 12 of a base substrate 100.

For example, an angle-adjusting layer may be firstly formed on the edge portion 12, and then is exposed and developed, thereby forming a plurality of angle-adjusting portions 102. The plurality of angle-adjusting portions 102 may be in a stair shape or in a sawtooth shape.

For example, a material of the angle-adjusting layer and/or a material of the angle-adjusting portion 102 may be inorganic substances such as SiyNx, $SiO_2$, SiNyOx, various polymers, etc. For example, a width of a tooth of the sawtooth may be the same as or similar to a width of the first pixel 1011, without limited thereto. For example, a cross section of the angle-adjusting portion 102 in a direction perpendicular to the base substrate may be in a shape of a triangle. For example, a length of a side of the triangle close to the main portion 11 may be the same as or similar to the width of the first pixel 1011.

Step 2. As illustrated in FIG. 6B, after forming the angle-adjusting portion 102, forming a first electrode 1111 on the angle-adjusting portion 102; the angle-adjusting portion 102 has a planar surface 1021, the first pixel 1011 is located on the planar surface 1021, for example, the first electrode 1111 is in contact with the planar surface 1021. For example, the first electrode 1111 on the first edge portion 121 is located on a right side of the angle-adjusting portion 102 where the first electrode 1111 is located, and the first electrode 1111 on the second edge portion 122 is located on a left side of the angle-adjusting portion 102 where the first electrode 1111 is located, that is, the first electrode 1111 is located on a side of the angle-adjusting portion 102 close to the main portion 11, so as to facilitate the first pixels 1011 on the angle-adjusting portion 102 to have the same or approximately the same light-emitting directions after the left and right edges are bent, so as to reduce the color shift problem at edge.

For example, in order to simplify the process, the second electrode 1121 may be formed during forming the first electrode 1111. That is, the first electrode 1111 and the second electrode 1121 may be formed from the same film layer by the same patterning process.

Step 3. As illustrated in FIG. 6C, after forming the first electrode 1111, forming a first pixel defining layer 1031 on the first electrode 1111, the first pixel defining layer 1031 is disposed around an edge of the first electrode 1111, the first pixel defining layer 1031 includes two pixel-defining portions 103101 and 103102 close to the edge portion 12 and away from the edge portion 12, respectively, and the pixel-defining portions 103101 and 103102 are located on edges of the angle-adjusting portion 102, respectively.

For example, after forming the second electrode 1121, forming a second pixel defining layer 1032 on the second electrode 1121. For example, in order to simplify the process, the first pixel defining layer 1031 and the second pixel defining layer 1032 may be formed from the same film layer by the same patterning process.

Step 4, performing an evaporation deposition process on the structure illustrated in FIG. 6C to form light-emitting functional layers 1112 and 1122 (see FIG. 3A and FIG. 3B).

For example, an evaporation deposition material may enter an evaporation deposition chamber from bottom to top.

Step 5, forming opposing electrodes 1113 and 1123 (see FIG. 5), thereby completing the fabrication of the first pixel 1011 and the second pixel 1012.

Step 6, forming a packaging layer.

Step 7, bending the edge portion to form a display panel with a curved edge. For example, the base substrate with the first pixel and the second pixel formed thereon may be bent at edge and then packaged, without particularly limited in the embodiment of the present disclosure.

For example, in addition to bending the base substrate on which the first pixel 1011 is formed, the base substrate on which the first pixel defining layer 1031 is formed may be bent, and after bending, performing an evaporation deposition process to form an evaporation deposition layer, thereby forming the first pixel 1011. For example, after the evaporation deposition layer is formed, forming the opposing electrode to form the first pixel 1011.

Figure 7:
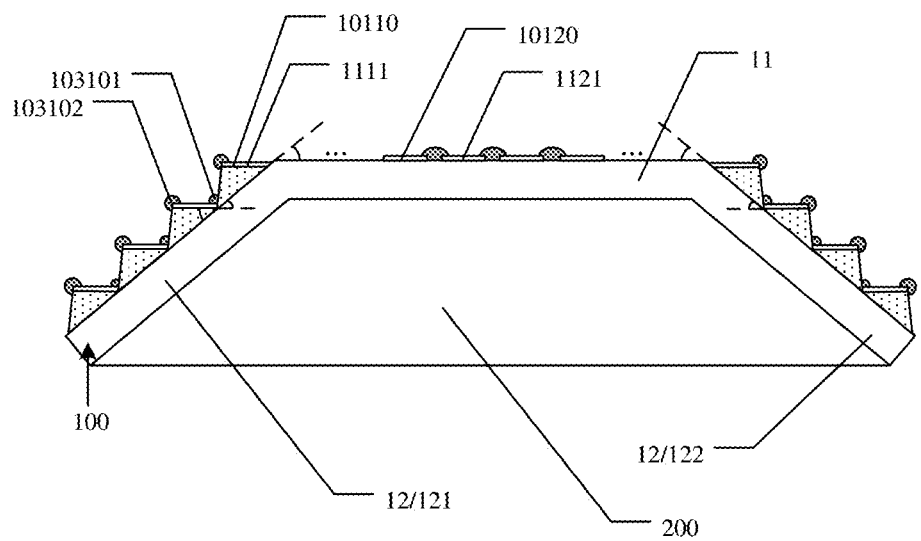
FIG. 7 is a schematic diagram illustrating a manufacturing method of a display substrate provided by another embodiment of the present disclosure.

FIG. 7 is a schematic diagram illustrating a manufacturing method of a display substrate provided by another embodiment of the present disclosure.

For example, forming an evaporation deposition layer by an evaporation deposition process on a bending machine 200. For example, the base substrate 100 may adopt a flexible base substrate.

For example, the evaporation deposition material may enter the evaporation deposition chamber from top to bottom. For example, the evaporation deposition layer may be the light-emitting functional layer as described above.

According to the manufacturing method of the display substrate provided by one or more embodiments of the present disclosure, by forming the angle-adjusting portion 102 on the edge portion 12 before forming the first pixel 1011 on the edge portion 12, the angle-adjusting portion 102 can be used to adjust an angle between the first light-emitting surface 10110 of the first pixel 1011 on the edge portion 12 and the edge portion 12, so that the light-emitting direction of the first pixel 1011 can be adjusted to reduce color shift.

At least one embodiment of the present disclosure further provides a display device including any of the above display substrates.

For example, the display device may be a display device such as electronic paper, an OLED display, and any product or component having a display function including these display devices such as a television, a digital camera, a mobile phone, a watch, a tablet computer, a notebook computer, a navigator and the like.

In the embodiments of present disclosure, a patterning to form a pattern or a patterning process may only include a photolithography process, or include a photolithography process and an etching process, or include other processes to form a preset pattern such as a printing process, and an inkjet process. A photolithography process includes forming a pattern by processes such as film forming, exposure, and development etc., by using photoresist, mask, exposure machine etc.

It should be explained that, for the purpose of clarity only, in accompanying drawings for illustrating the embodiment (s) of the present disclosure, a layer or an area may be enlarged. It should be understood that, in the case in which a component such as a layer, film, area, substrate or the like is referred to be "on" or "under" another component, it may be directly on or under the another component or a component is interposed therebetween.

Moreover, in case of no conflict, features in one embodiment or in different embodiments can be combined.

The above are only specific implementations of the present disclosure, without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:
1. A display substrate, comprising:
   a base substrate comprising a main portion and an edge portion located on at least one side of the main portion;
   a first pixel located on the edge portion and comprising a first light-emitting surface;
   a second pixel located on the main portion; and an angle-adjusting portion located between the first pixel and the edge portion and configured to provide an included angle between the first light-emitting surface and a part of the edge portion where the first pixel is located, the included angle being an acute angle, wherein the edge portion is curved with respect to the main portion, the edge portion curves towards a direction away from the second pixel, and a light-emitting direction of the first pixel located on the edge portion is the same or substantially the same as a light-emitting direction of the second pixel located on the main portion.

2. The display substrate according to claim 1, wherein the acute angle is greater than or equal to 30° and less than or equal to 60°.

3. The display substrate according to claim 1, wherein a cross-section of the angle-adjusting portion in a direction perpendicular to the base substrate is in a shape of a triangle.

4. The display substrate according to claim 3, wherein an angle of the triangle opposite to the edge portion is greater than or equal to 80° and less than or equal to 120°.

5. The display substrate according to claim 1, wherein the angle-adjusting portion has a planar surface on which the first pixel is located.

6. The display substrate according to claim 5, wherein the planar surface is parallel with the main portion.

7. The display substrate according to claim 5, wherein the first pixel comprises a first electrode that is in contact with the planar surface.

8. The display substrate according to claim 7, further comprising a first pixel defining layer located on the edge portion, wherein the first pixel defining layer is arranged around an edge of the first electrode, the first pixel defining layer comprises a first pixel-defining portion close to the edge portion and a second pixel-defining portion away from the edge portion, and the first pixel-defining portion and the second pixel-defining portion are located on edges of the angle-adjusting portion, respectively.

9. The display substrate according to claim 8, wherein a cross-section of the first pixel-defining portion in a direction perpendicular to the base substrate is in a shape of a sector with an acute angle or a right angle.

10. The display substrate according to claim 8, wherein a cross-section of the second pixel-defining portion in a direction perpendicular to the base substrate is in a shape of a sector having a central angle greater than 180°.

11. The display substrate according to claim 1, wherein the second pixel comprises a second light-emitting surface, and the first light-emitting surface is parallel with the second light-emitting surface.

12. The display substrate according to claim 1, wherein the first pixel comprises a plurality of first pixels, the angle-adjusting portion comprises a plurality of angle-adjusting portions, the plurality of angle-adjusting portions are in a one-to-one correspondence with the plurality of first pixels, and the plurality of angle-adjusting portions are in a stair shape or in a sawtooth shape.

13. A manufacturing method of a display substrate, comprising:

forming an angle-adjusting portion on an edge portion of a base substrate, the base substrate further comprising a main portion, the edge portion being located on at least one side of the main portion;

forming a first pixel on the angle-adjusting portion, the first pixel comprising a first light-emitting surface; and forming a second pixel on the main portion, wherein the angle-adjusting portion is configured to provide an included angle between the first light-emitting surface and a part of the edge portion where the first pixel is located, and the included angle is an acute angle, and wherein the edge portion is curved with respect to the main portion, the edge portion curves towards a direction away from the second pixel, and a light-emitting direction of the first pixel located on the edge portion is the same or substantially the same as a light-emitting direction of the second pixel located on the main portion.

14. The manufacturing method of the display substrate according to claim 13, wherein forming the first pixel comprises forming a first electrode, and the angle-adjusting portion has a planar surface on which the first pixel is located.

15. The manufacturing method of the display substrate according to claim 14, wherein the first electrode is in contact with the planar surface.

16. The manufacturing method of the display substrate according to claim 15, wherein forming the first pixel further comprises forming a first pixel defining layer on the first electrode, wherein the first pixel defining layer is arranged around an edge of the first electrode, the first pixel defining layer comprises a first pixel-defining portion close to the edge portion and a second pixel-defining portion away from the edge portion, and the first pixel-defining portion and the second pixel-defining portion are located on edges of the angle-adjusting portion, respectively.

17. The manufacturing method of the display substrate according to claim 16, further comprising bending the base substrate with the first pixel defining layer formed thereon, and forming an evaporation deposition layer by an evaporation deposition process after bending the base substrate to form the first pixel.

18. The manufacturing method of the display substrate according to claim 13, further comprising bending the base substrate with the first pixel formed thereon.

19. A display device comprising the display substrate according to claim 1.

* * * * *